United States Patent
Xiang et al.

(10) Patent No.: US 9,418,869 B2
(45) Date of Patent: Aug. 16, 2016

(54) METHOD TO ETCH A TUNGSTEN CONTAINING LAYER

(71) Applicant: Lam Research Corporation, Fremont, CA (US)

(72) Inventors: Hua Xiang, Pleasanton, CA (US); Qian Fu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 210 days.

(21) Appl. No.: 14/445,975

(22) Filed: Jul. 29, 2014

(65) Prior Publication Data

US 2016/0035585 A1     Feb. 4, 2016

(51) Int. Cl.
*H01L 21/3213*  (2006.01)

(52) U.S. Cl.
CPC .................. *H01L 21/32136* (2013.01)

(58) Field of Classification Search
None
See application file for complete search history.

(56) References Cited

U.S. PATENT DOCUMENTS

| | | | |
|---|---|---|---|
| 4,786,360 A | 11/1988 | Cote et al. | |
| 4,836,886 A * | 6/1989 | Daubenspeck | H01L 21/3065 216/67 |
| 5,108,542 A | 4/1992 | Lin | |
| 5,846,886 A * | 12/1998 | Hattori | C23F 4/00 257/E21.31 |
| 5,866,483 A | 2/1999 | Shiau et al. | |
| 6,277,763 B1 * | 8/2001 | Kugimiya | C23F 4/00 156/345.33 |
| 6,461,974 B1 * | 10/2002 | Ni | C23F 4/00 257/E21.252 |
| 6,551,942 B2 * | 4/2003 | Naeem | H01L 21/32136 257/E21.311 |
| 6,576,152 B2 * | 6/2003 | Matsutani | C23F 4/00 216/11 |
| 8,518,282 B2 | 8/2013 | Lee et al. | |
| 9,190,293 B2 * | 11/2015 | Wang | H01L 21/32136 |
| 2003/0227258 A1 | 12/2003 | Strang et al. | |
| 2014/0120727 A1 | 5/2014 | Subramanian et al. | |

* cited by examiner

*Primary Examiner* — Anita Alanko
(74) *Attorney, Agent, or Firm* — Beyer Law Group LLP

(57) ABSTRACT

A method for etching a tungsten containing layer is provided. An etch gas is provided comprising $O_2$ and a fluorine containing component, wherein the etch gas has at least as many oxygen atoms as fluorine atoms. A plasma is formed from the etch gas. The tungsten containing layer is etched with the plasma formed from the etch gas.

17 Claims, 4 Drawing Sheets

METHOD TO ETCH A TUNGSTEN CONTAINING LAYER

BACKGROUND OF THE INVENTION

The present invention relates to selectively etching a tungsten (W) containing layer during the production of a semiconductor device.

During semiconductor wafer processing, features may be etched through a tungsten containing layer.

During the formation of certain features with tungsten, the tungsten must be selectively etched, while silicon, silicon oxide, silicon oxynitride, silicon nitride, or titanium nitride is minimally etched. Previously, such selectivity could not be accomplished.

SUMMARY OF THE INVENTION

To achieve the foregoing and in accordance with the purpose of the present invention, a method of etching a tungsten containing layer is provided. An etch gas is provided comprising $O_2$ and a fluorine containing component, wherein the etch gas has at least as many oxygen atoms as fluorine atoms. A plasma is formed from the etch gas. The tungsten containing layer is etched with the plasma formed from the etch gas.

In another manifestation of the invention, a method of selectively etching features in a tungsten layer with respect to a silicon oxide layer is provided. An etch gas is provided comprising $O_2$, $N_2$, and a fluorine containing component, wherein the etch gas has at least as many oxygen atoms as fluorine atoms and at least as many nitrogen atoms as fluorine atoms. A plasma is formed from the etch gas. A chamber pressure of at least 60 mTorr is maintained. A bias of between 100 and 400 volts is provided. The tungsten layer is etched with the plasma formed from the etch gas to form features with an aspect ratio of at least 10 to 1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
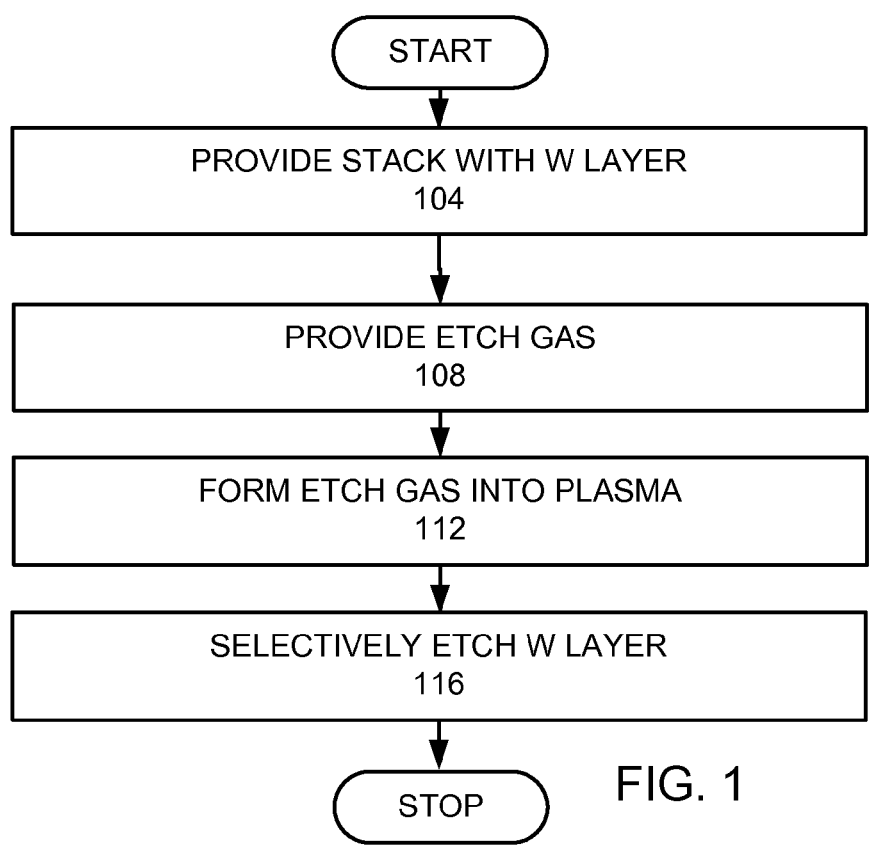
FIG. 1 is a high level flow chart of an embodiment of the invention.

To facilitate understanding, FIG. 1 is a high level flow chart of a process used in an embodiment of the invention. A substrate with a stack with at least one W containing layer is provided (step 104). An etch gas is provided (step 108). The etch gas is formed into a plasma (step 112). The W containing layer is selectively etched (step 116).

Examples

Figure 2A:
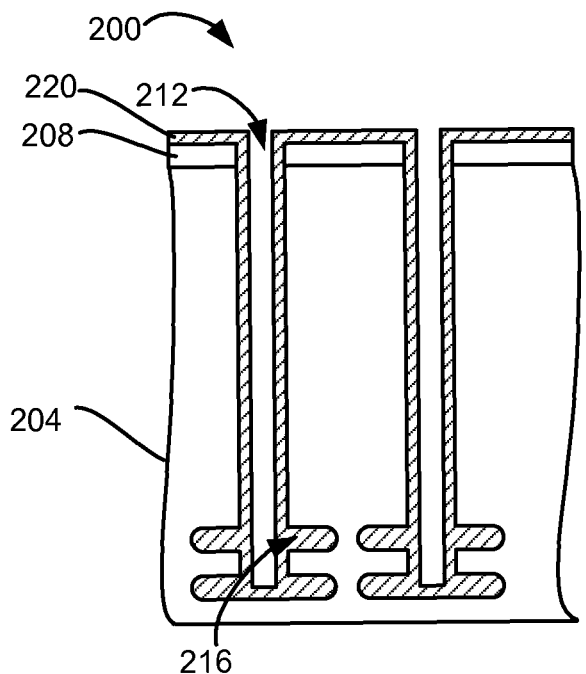
FIGS. 2A-B are schematic views of a stack processed according to an embodiment of the invention.

In an example of a preferred embodiment of the invention, a substrate with a stack with at least a tungsten containing layer is provided (step 104). FIG. 2A is a cross-sectional view of a stack 200 with a substrate layer or feature layer 204 disposed below an upper layer 208. In this example, the feature layer 204 is silicon and the upper layer 208 is of silicon oxide. Features 212 have been formed in the feature layer 204. Lateral features 216 have been formed in sidewalls of the features 212. A W containing layer 220 is deposited over the stack 200. Such a deposition may be made using electroplating or electroless deposition or another method of depositing a conformal metallic layer.

Figure 3:
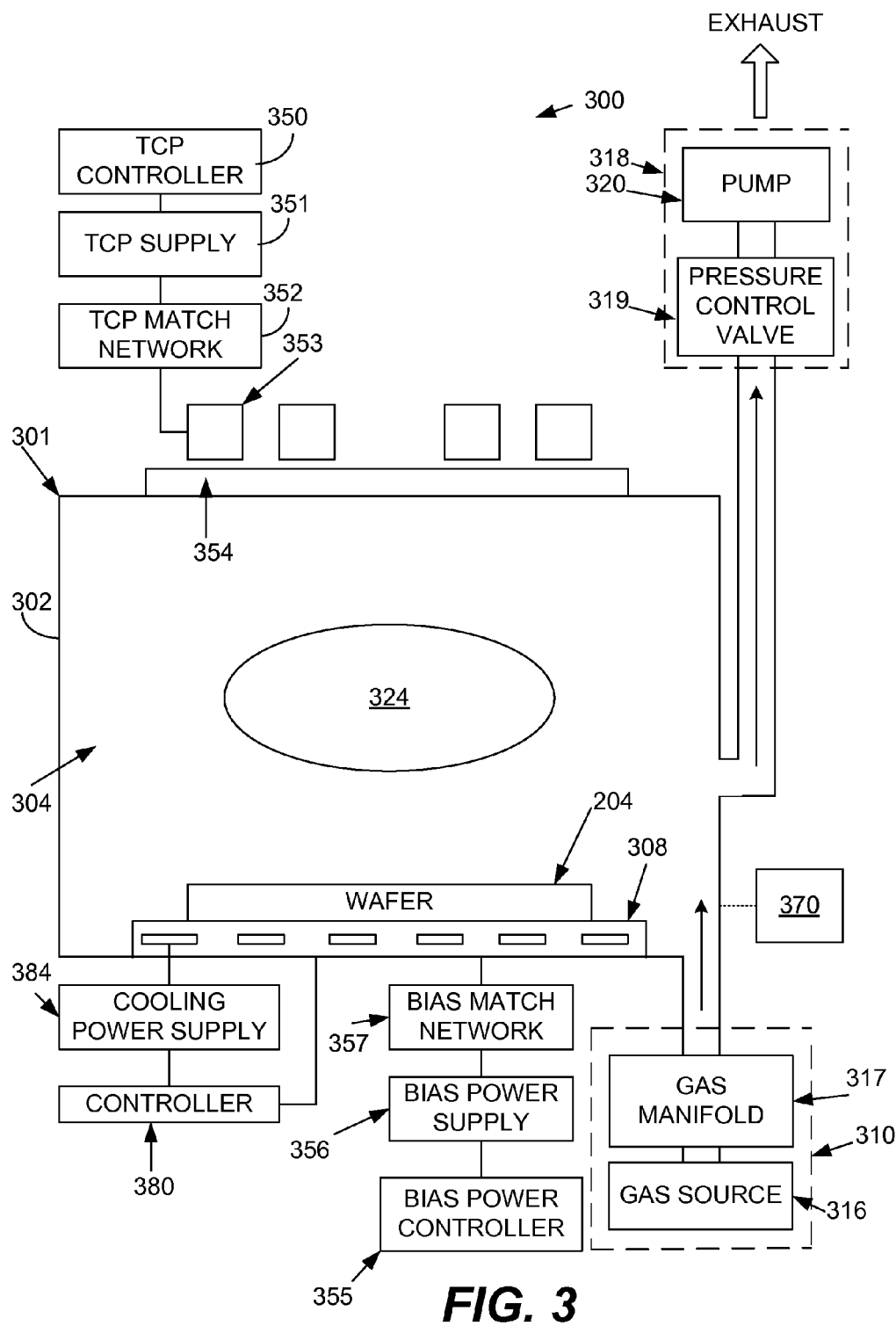
FIG. 3 is a schematic view of an etch reactor that may be used for etching.

In one embodiment, all processing may be performed in a single plasma etch chamber. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP supply 351 and a bias power supply 356 influencing the plasma 324 created within plasma processing chamber 304.

The TCP controller 350 sets a set point for TCP supply 351 configured to supply a radio frequency signal at 13.56 MHz, tuned by a TCP match network 352, to a TCP coil 353 located near the plasma processing chamber 304. An RF transparent window 354 is provided to separate TCP coil 353 from plasma processing chamber 304, while allowing energy to pass from TCP coil 353 to plasma processing chamber 304.

The bias power controller 355 sets a set point for bias power supply 356 configured to supply an RF signal, tuned by bias match network 357, to a chuck electrode 308 located within the plasma processing chamber 304 creating a direct current (DC) bias above electrode 308 which is adapted to receive the wafer with the feature layer 204, being processed.

A gas supply mechanism or gas source 310 includes a source or sources of gas or gases 316 attached via a gas manifold 317 to supply the proper chemistry required for the process to the interior of the plasma processing chamber 304. A gas exhaust mechanism 318 includes a pressure control valve 319 and exhaust pump 320 and removes particles from within the plasma processing chamber 304 and maintains a particular pressure within plasma processing chamber 304.

A temperature controller 380 controls the temperature of a cooling recirculation system provided within the chuck electrode 308 by controlling a cooling power supply 384. The plasma processing system also includes electronic control circuitry 370, which may be used to control the bias power controller 355, the TCP controller 350, the temperature controller 380, and other control systems. The plasma processing system 300 may also have an end point detector. An example of such an inductively coupled system is the Kiyo built by Lam Research Corporation of Fremont, Calif., which is used to etch silicon, polysilicon and conductive layers, in addition to dielectric and organic materials. In other embodiments of the invention, a capacitively coupled system may be used.

Figure 4:
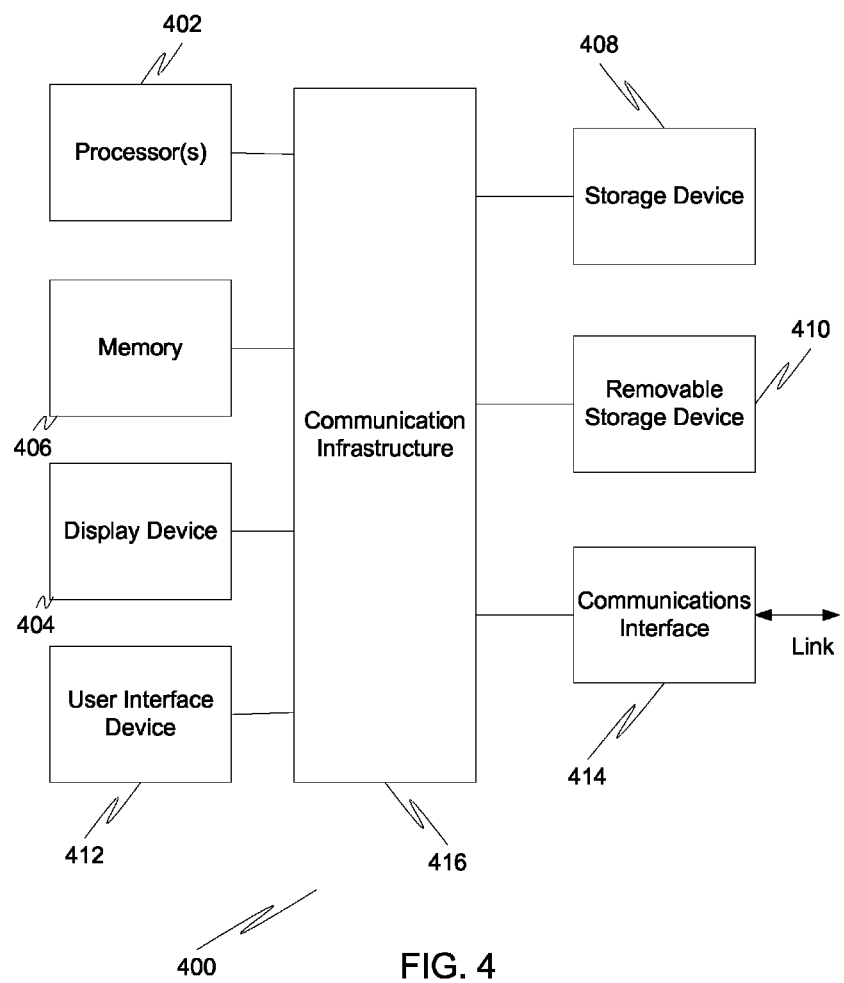
FIG. 4 illustrates a computer system, which is suitable for implementing a controller used in embodiments of the present invention.

FIG. 4 is a high level block diagram showing a computer system 400, which is suitable for implementing a control circuitry 370 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

An etch gas is provided from the gas source 316 into the plasma processing chamber 304 (step 108). In this embodiment, the etch gas comprises oxygen, nitrogen, and a fluorine containing component. An example of a etch gas recipe would be 80 sccm $CF_4$, 160 sccm $O_2$, and 160 sccm $N_2$.

The etch gas is formed into a plasma (step 112). In this example, 1800 watts of TCP power at 13.5 MHz is provided to form the etch gas into a plasma. The W layer 220 is etched (step 116). A bias of 0~100 volts is provided. The chamber pressure is maintained at 180 mTorr. The W layer is maintained at 60° C. The process is maintained for 100~200 seconds.

Figure 2B:
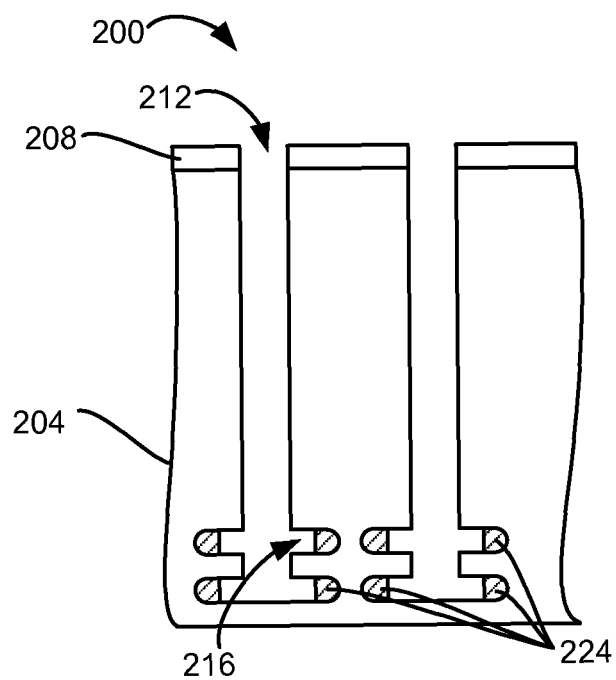

FIG. 2B is a cross-sectional schematic view of the stack 200 after the W layer has been etched. The etch has etched away much of the W layer leaving W features 224 with minimal etching of the feature layer 204. A highly selective etch is needed for such a result.

Preferably, the etch gas comprises $O_2$ and a fluorine containing component, where the etch gas has at least as many oxygen atoms as fluorine atoms. More preferably, the etch gas also comprises $N_2$ where there are at least as many nitrogen atoms as fluorine atoms. It is believed that the preferred concentrations of oxygen and nitrogen increases the production of $WO_xN_y$, where x and y are positive integers. The fluorine reacts with the $WO_xN_y$ to form $WO_xF_z$. In the above example, there are at least twice as many oxygen molecules as fluorine containing molecules. In addition, there are least twice as many nitrogen molecules than fluorine containing molecules. It is believed that when the tungsten containing layer is selectively etched with respect to a nitrogen containing layer, the presence of nitrogen in the etch gas helps protect the nitrogen containing layer to improve etch selectivity.

Preferably, a pressure of at least 30 mTorr is provided during the etching process. Without being bound by theory, it is believed that a pressure higher than 30 mTorr reduces plasma density, which reduces bombardment. This allows chemical etching to be more dominant over physical etching, which uses bombardment, which improves selectivity. In addition, it is believed that a higher pressure also improves top-to-bottom W containing layer etch uniformity, while allowing a high aspect ratio for a tungsten etch. More preferably, the pressure is at least 100 mTorr.

Preferably, the W layer is maintained at a temperature of at least 30° C. More preferably, the W layer is maintained at a temperature of at least 60° C. Most preferably, the W layer is maintained at a temperature of between 30° C. and 90° C. It is believed that the higher temperatures further increase selectivity. However, if the temperature is too high, the ratio of CD at the top to CD at the bottom may become too high, because if the temperature is too high the top of the tungsten will etch faster.

Preferably, the bias is between 100-400 volts. It is believed that if the bias is too low, then protection for feature bottom from $O_2$ is too low. It is believed that a sufficiently high bias is needed to cause the etch byproduct, mainly polymer, to be redeposited on the etch front, which may help to protect the feature bottom from further etching. In addition, with high aspect ratio features, certain bias voltages help to enable top-to-bottom uniform W recess. In addition, futher higher bias voltages will lead to punch through the feature bottom, which will completely damage the device. If the bias is too high, then bombardment will be too high, which as explained above, reduces selectivity. More preferably, no bias is provided during the W layer etch, which is good for lateral W etch.

The selective etch is useful in providing semiconductor devices with tungsten layers. An example of such a device may be a three dimensional NAND with tungsten recesses. Embodiments allow the etching of high aspect ratio features in pure tungsten or a tungsten alloy. High aspect ratio features have a ratio of height to space width of at least 10:1. In addition, embodiments of the invention provide a width of the top to width of the bottom of the etch features (top/bottom) ratio of between 1.5:1 and 1:1.5. More preferably, the top/bottom ratio is between 1.25:1 and 1:1.25. More preferably, the top/bottom ratio is 1:1. Embodiments provide an etch with a tungsten to silicon oxide etch selectivity of at least 2:1. More preferably, the etch selectivity is at least 4:1. Most preferably, the selectivity is at least 50:1. Embodiments provide a total gas flow of less than 1,000 sccm. In various embodiments, the flow rate of oxygen atoms is at least twice the flow rate of fluorine atoms. In various embodiments, the flow rate of nitrogen atoms is also at least twice the flow rate of fluorine atoms.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a tungsten containing layer, comprising:
  providing an etch gas comprising $O_2$, $N_2$, and a fluorine containing component, wherein the etch gas has at least as many oxygen atoms as fluorine atoms and at least as many nitrogen atoms as fluorine atoms;
  forming a plasma from the etch gas; and
  etching the tungsten containing layer with the plasma formed from the etch gas.

2. The method as recited in claim 1, further comprising providing a pressure of at least 30 mTorr.

3. The method, as recited in claim 2, further comprising heating the tungsten layer to at least 30° C.

4. The method, as recited in claim 3, further comprising providing a bias of between 100 to 400 volts.

5. The method, as recited in claim 4, wherein an exposed layer of Si, SiO, SiN, or TiN is exposed to the etch of the tungsten containing layer, wherein the etching of the tungsten containing layer selectively etches the tungsten containing layer with respect to the exposed layer.

6. The method, as recited in claim 3, further comprising providing a bias of less than 400 volts.

7. The method, as recited in claim 3, wherein the etching the tungsten is maintained until features with aspect ratios of at least 10:1 are etched into the tungsten containing layer.

8. The method, as recited in claim 3, wherein a total etch gas flow is no more than 1000 sccm.

9. The method, as recited in claim 1, further comprising providing a pressure of at least 60 mTorr.

10. The method, as recited in claim 1, further comprising heating the tungsten containing layer to at least 60° C.

11. The method, as recited in claim 1, further comprising providing a bias of between 100 to 400 volts.

12. The method, as recited in claim 1, wherein an exposed layer of Si, SiO, SiN, or TiN is exposed to the etch of the tungsten containing layer, wherein the etching of the tungsten containing layer selectively etches the tungsten containing layer with respect to the exposed layer.

13. The method, as recited in claim 1, further comprising providing a bias of less than 400 volts.

14. The method, as recited in claim 1, wherein the etching the tungsten is maintained until features with aspect ratios of at least 10:1 are etched into the tungsten containing layer.

15. The method, as recited in claim 1, wherein a total etch gas flow is no more than 1000 sccm.

16. The method, as recited in claim 1, wherein the tungsten containing layer is pure tungsten.

17. A method of selectively etching features in a tungsten layer with respect to a Si, SiO, SiN, or TiN layer, comprising:
  providing an etch gas comprising $O_2$, $N_2$, and a fluorine containing component, wherein the etch gas has at least as many oxygen atoms as fluorine atoms and at least as many nitrogen atoms as fluorine atoms;
  forming a plasma from the etch gas;
  maintaining a chamber pressure of at least 60 mTorr;
  providing a bias of between 100 and 400 volts; and
  etching the tungsten layer with the plasma formed from the etch gas to form features with an aspect ratio of at least 10 to 1.

* * * * *